United States Patent [19]
Cooper

[11] Patent Number: 4,868,428
[45] Date of Patent: Sep. 19, 1989

[54] APPARATUS FOR SHIFTING THE FREQUENCY OF COMPLEX SIGNALS

[76] Inventor: J. Carl Cooper, 1373 Sydney Dr., Sunnyvale, Calif. 94087

[21] Appl. No.: 172,283

[22] Filed: Mar. 23, 1988

Related U.S. Application Data

[63] Continuation of Ser. No. 16,923, Feb. 20, 1987, Pat. No. 4,829,257.

[51] Int. Cl.$^4$ .......................... G06G 7/00; H03K 5/13
[52] U.S. Cl. ...................... 307/529; 307/511; 307/522; 307/262; 307/271; 328/155; 328/133; 328/109
[58] Field of Search ............... 307/262, 271, 513, 511, 307/522, 529; 328/109, 55, 28, 21, 23, 24, 155, 133, 138, 140

[56] References Cited

U.S. PATENT DOCUMENTS

| | | | |
|---|---|---|---|
| 3,223,928 | 12/1965 | Fayman | 328/23 |
| 3,229,230 | 1/1966 | Feldman | 332/43 B |
| 3,296,517 | 1/1967 | Routh et al. | 307/529 |
| 3,621,406 | 11/1971 | Paine | 328/155 |
| 3,993,956 | 11/1976 | Gilmore et al. | 329/104 |
| 4,352,210 | 9/1982 | Puckette | 307/529 |
| 4,379,264 | 4/1983 | Lenhardt | 328/24 |
| 4,558,283 | 12/1985 | Yamagiwa | 307/529 |

OTHER PUBLICATIONS

"Understanding Mixers", Mini Circuits, pp. 1-7.
"A Review of SSB Phasing Techniques", Ham Radio, Jan. 1978, Roger Harrison.

*Primary Examiner*—Stanley D. Miller
*Assistant Examiner*—Richard Roseen
*Attorney, Agent, or Firm*—Woodling, Krost and Rust

[57] ABSTRACT

The invention described herein provides an apparatus and method for accurately shifting the phase or frequency of a complex signal.

24 Claims, 4 Drawing Sheets

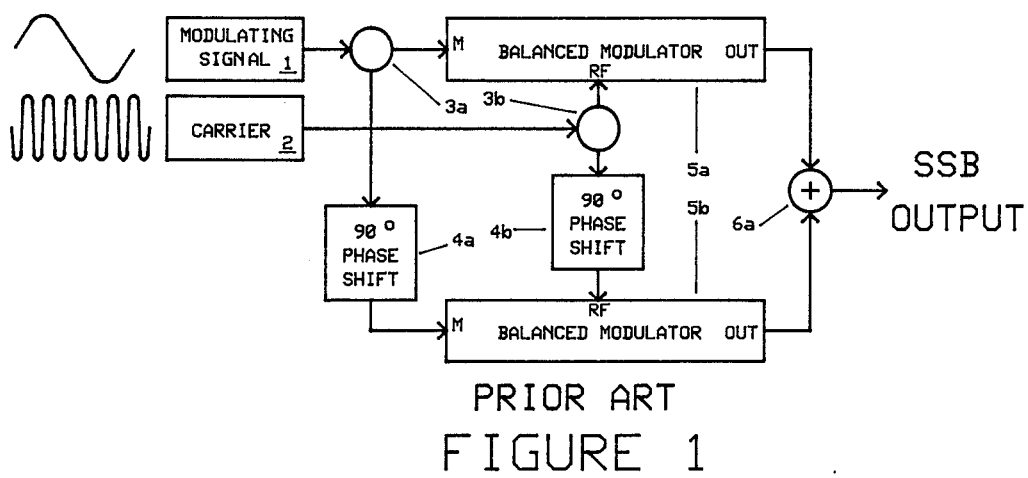
PRIOR ART
FIGURE 1
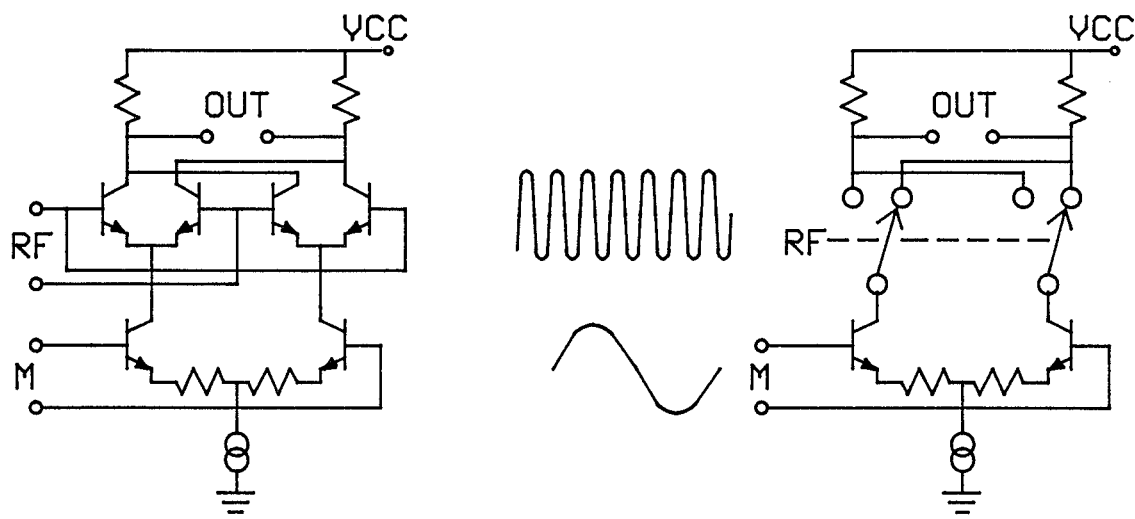
BALANCED MODULATOR 7
FIGURE 2a
EQUIVALENT CIRCUIT 8
FIGURE 2b
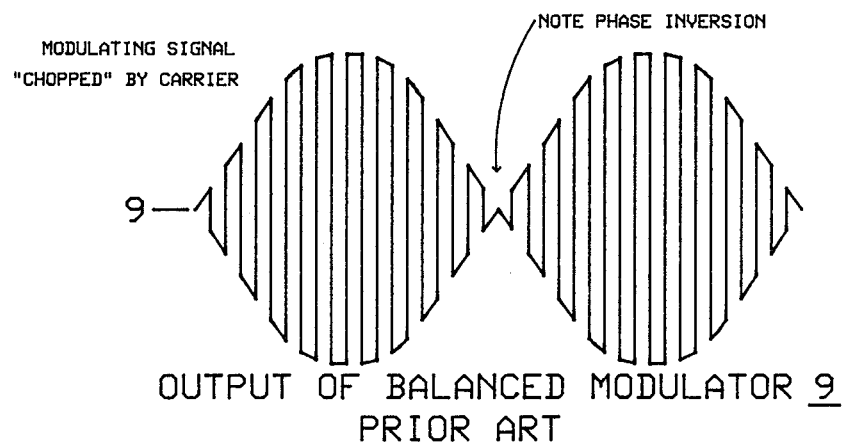
OUTPUT OF BALANCED MODULATOR 9
PRIOR ART
FIGURE 2c

APPARATUS FOR SHIFTING THE FREQUENCY OF COMPLEX SIGNALS

The present application is a continuation-in-part of application Ser. No. 07/016,923 filed Feb. 20, 1987, now U.S. Pat. No. 4,829,257 issued May 9, 1989, which is incorporated by reference. An understanding of the parent application, especially with respect to the description of FIG. 7 will aid in the apprecation of the inventive concepts described herein.

BACKGROUND OF THE INVENTION

1. Field of the Invention

The present invention relates to the fields of single sideband modulation and shifting the frequency of complex signals of a repetitive or nonrepetitive nature. In particular the invention relates to adding the frequency or phase of one single to another to shift the frequency or phase of said other signal, or frequency addition.

2. Description of the Prior Art

Often in electronic system design, it is desirable to change the frequency of a given complex system, however no such circuitry is believed to exist which can directly effect such a change. As a result the complex signal must be regenerated at a new frequency by various techniques such as tape recording at one speed and playing back at another, or digitizing the signal at a given rate with an A-D converter, buffering in memory and reconstructing the signal via a D-A converter at a different rate. These systems do not however actually change the frequency of the signal, but rather time compress or expand the signal.

Single sideband modulators are known which have the ability of generating a sideband of a carrier in response to a modulating signal. In the SSB modulators, a fixed frequency carrier is modulated in a fashion to generate sidebands which contain both amplitude and frequency information of the modulating signal. Generally, these modulators are utilized to provide voice communications where the modulating signal occupies a voice bandwidth from a few hundred Hz to a few kilohertz. These modulators are useful only when the carrier is considerably higher in frequency than the modulating signal. These modulators are not useful for shifting the phase of the carrier, or for providing slifht frequency shifts to the carrier since the 90 degree phase shifter which operates on the modulating signal does not operate at low frequencies.

A SSB modulator is shown in block form in FIG. 1. It can be seen that a modulating signal 1 is applied to a splitter 3a where it is split and applied to the M input of a first balanced modulator 5a, and via a 90 degree phase shifter 4a to the second balanced modulator 5b. Similarly, a carrier signal 2 is split, and applied to the RF inputs of the balanced modulators 5a and 5b, with the second carier input also being passed through a 90 degree phase shifter 4b. The two signals output from the outputs of the balanced modulators are combined in an adder 6a to create the SSB signal. Because the balanced modulators generate components at odd harmonics of the carrier frequency, a push pull vector type adder is often used for adder 6 in order to minimize the harmonic components. More information on SSB modulators can be found in "Reference Data for Radio Engineers" published by Howard W. Sams & Co., Inc. Indianapolis, Indiana 46268 Copyright 1968. Section 23 contains much information on modulators. An article by Roger Harrison, "A Review of SSB Phasing Techniques," Ham Radio Magazine, (January 1978), provides good information on the subject as well. It might be noted that all of the 90 degree modulating signal (audio) phase shifters shown in this prior art article are AC coupled and/or do not operate at DC. In contrast the present application teaches a method and apparatus to overcome this limitation.

FIG. 2a shows a schematic diagram 7 of a balanced modulator, along with the equivalent circuit 8 in FIG. 2b. A waveform of a typical ouptut is shown in FIG. 2c. Note that the balanced modulator essentially switches the polarity of the modulating signal at the carrier frequency. In other words, the modulating signal is "chopped" by the carrier. No amplitude information of the carrier is passed by the switches, only timing (frequency) information. One wishing more information on balanced modulators, and SSB modulation can refer to the book by Donald G. Fink, "Electronic Engineers' Handbook", (McGraw-Hill, 1975), Section 8–77, is particularly useful.

Clearly, the SSB modulation scheme is not suitable for shifting the frequency of a complex signal by a small amount. It would be possible for the carrier frequency to be shifted by the frequency of the modulating signal having a frequency within the passband of the 90° phase shifter, however no amplitude information on the carrier would be passed by the circuit, due to the switching nature of the balanced modulator. It could be said that the modulating signal is shifted in frequency by the carrier, however the amount of frequency shift is many times the modulating signal frequency, and the system would not work at all for frequency shifts less than the modulating signal frequency. In addition, the SSB modulator generates spurious components at odd harmonics of the carrier frequency, due mainly to the fact that the balanced modulators are switching type devices, and the signal output from the output is essentially a square wave at the carrier frequency which is amplitude modulated. The SSB modulator is not useful for shifting or controlling the phase of a carrier in any fashion partially due to the switching nature of the balanced modulators, and due to the limited bandwidth nature of the 90 degree phase shift network for the modulating signal.

SUMMARY OF THE INVENTION

The present invention described herein provides a means and apparatus for accurately shifting the frequency or phase of a complex signal without time shifting the signal, while preserving the amplitude information of that signal. The teachings may be utilized to shift the frequency or phase of an amplitude modulated signal, thus creating a signal which is both amplitude and phase or frequency modulated. Various embodiments are taught which may be selected and optimized for particular applications. Embodiments which are capable of passing amplitude information of both a first and second signal which are added in frequency are shown. Other embodiments teach means for precisely shifting the phase of a carrier or complex signal, and means for precisely shifting the frequency of a carrier or complex signal.

Other objects and a fuller understanding of this invention may be had by referring to the following description and claims, taken in conjunction with the accompanying drawings.

BRIEF DESCRIPTION OF THE DRAWINGS

FIG. 1 is a drawing of a prior art single sideband modulator.

FIGS. 2a and 2b are drawings of a balanced modulator. An equivalent circuit with typical waveform is shown in FIG. 2c.

DESCRIPTION OF THE PREFERRED EMBODIMENTS

Figure 3A:
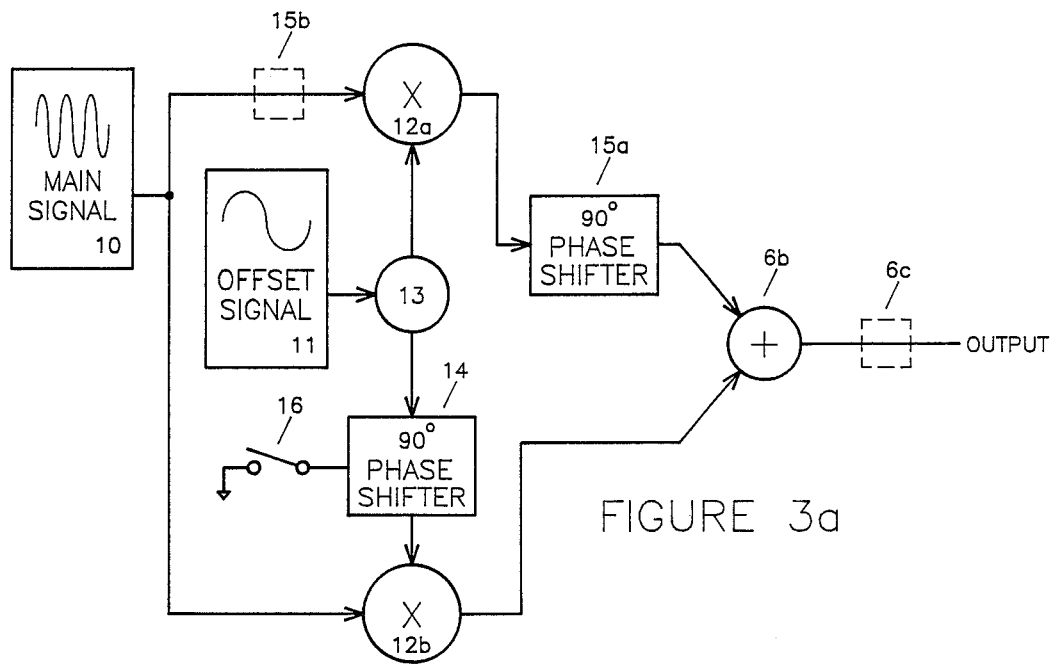
FIG. 3a is a drawing of a first embodiment of the present invention. A typical waveform is shown in FIG. 3b.

FIG. 1 shows a block diagram of a prior art SSB modulator which typically would be used with communications devices, showing modulating signal 1, carrier 2, splitters 3a and 3b, 90 degree phase shifters 4a and 4b, balanced modulators 5a and 5b and vector adder 6a.

FIG. 2a shows a schematic of a prior art balanced modulator 7 and FIG. 2b the equivalent circuit 8. FIG. 2c shows a typical balanced modulator output waveform 9.

Figure 3B:
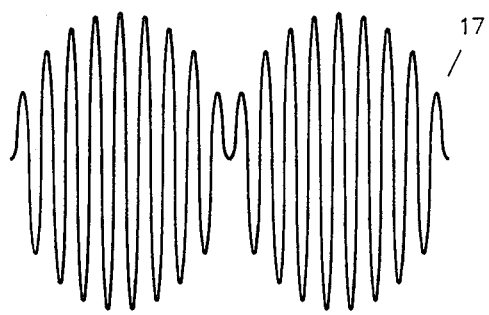

FIG. 3a shows a first embodiment of the invention having a main signal generator means 10, an offset signal generator means 11, portion generator means 12a and 12b splitter means 13, offset signal +/−90 degree phase shifter means 14, ± phase shift control 16, main signal 90 degree phase shifter means 15a, alternate main signal 90 degree phase shifter means location 15b vector adder means 6b, optional amplitude controlling means 6c. FIG. 3b shows a typical multiplier means output waveform 17.

Figure 4:
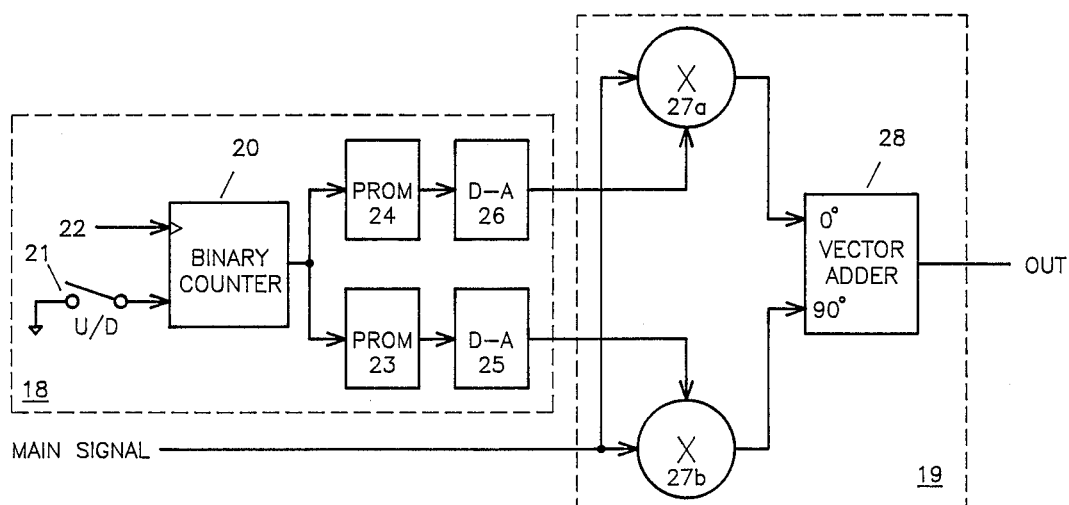
FIG. 4 is a drawing of a second embodiment of the present invention.

FIG. 4 shows a second embodiment of the invention having a offset signal generator means 18 comprised of digital counter 20, up down control 21, clocked signal 22 sine lookup 24, cosine lookup 23, D-A converters 25, and 26; and main signal combiner means 19 comprised of portion generators 27a and 27b and vector adder 28.

Figure 5:
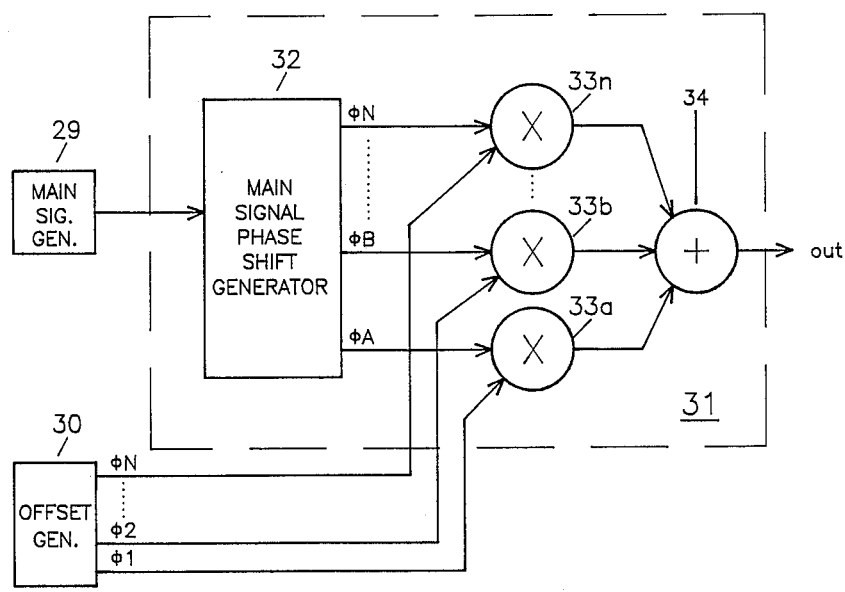
FIG. 5 is a drawing of a third embodiment of the present invention.

FIG. 5 shows a third embodiment of the invention having a main signal generator means 29, an offet signal generator means 30, and a main signal combiner means 31 comprised of main signal phase shifter 32, portion generators 33a thru 33n and vector adder 34.

Figure 6:
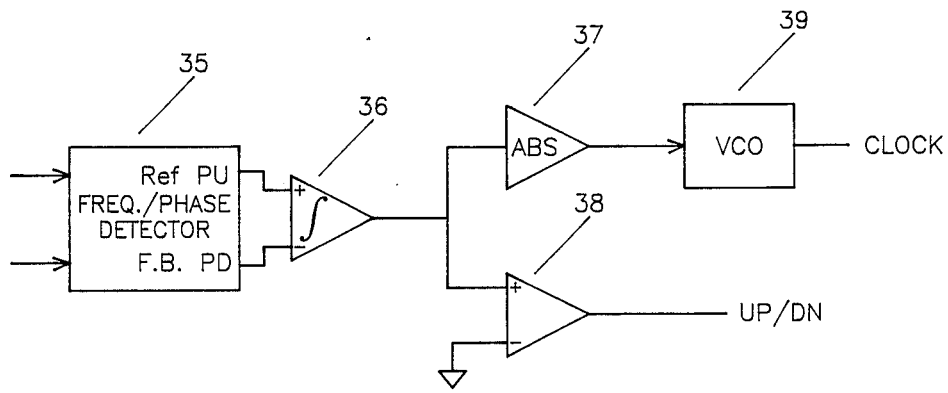
FIG. 6 is a drawing of a frequency error detector for use with the invention.

FIG. 6 shows a frequency error detector having phase detector means 35, error integrator means 36, absolute value amplifier means 37, polarity detecter means 38 and voltage controlled oscillator means 39.

Figure 7:
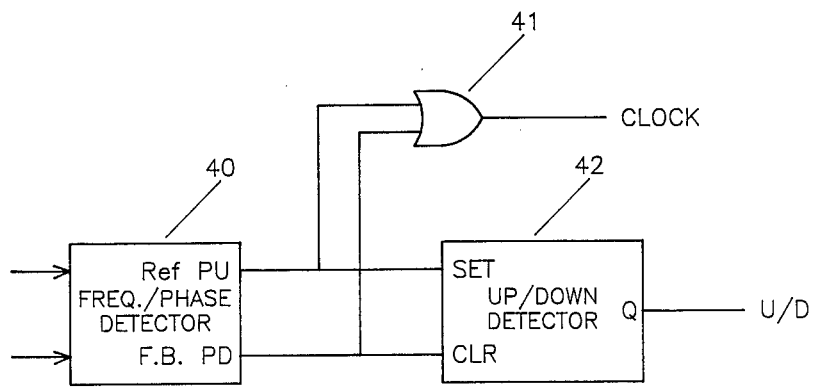
FIG. 7 is a drawing of a phase error detector for use with the invention.

FIG. 7 shows a phase error detecter having phase detector means 40, pulse combiner means 41, and up/-down detector means 42.

Figure 8:
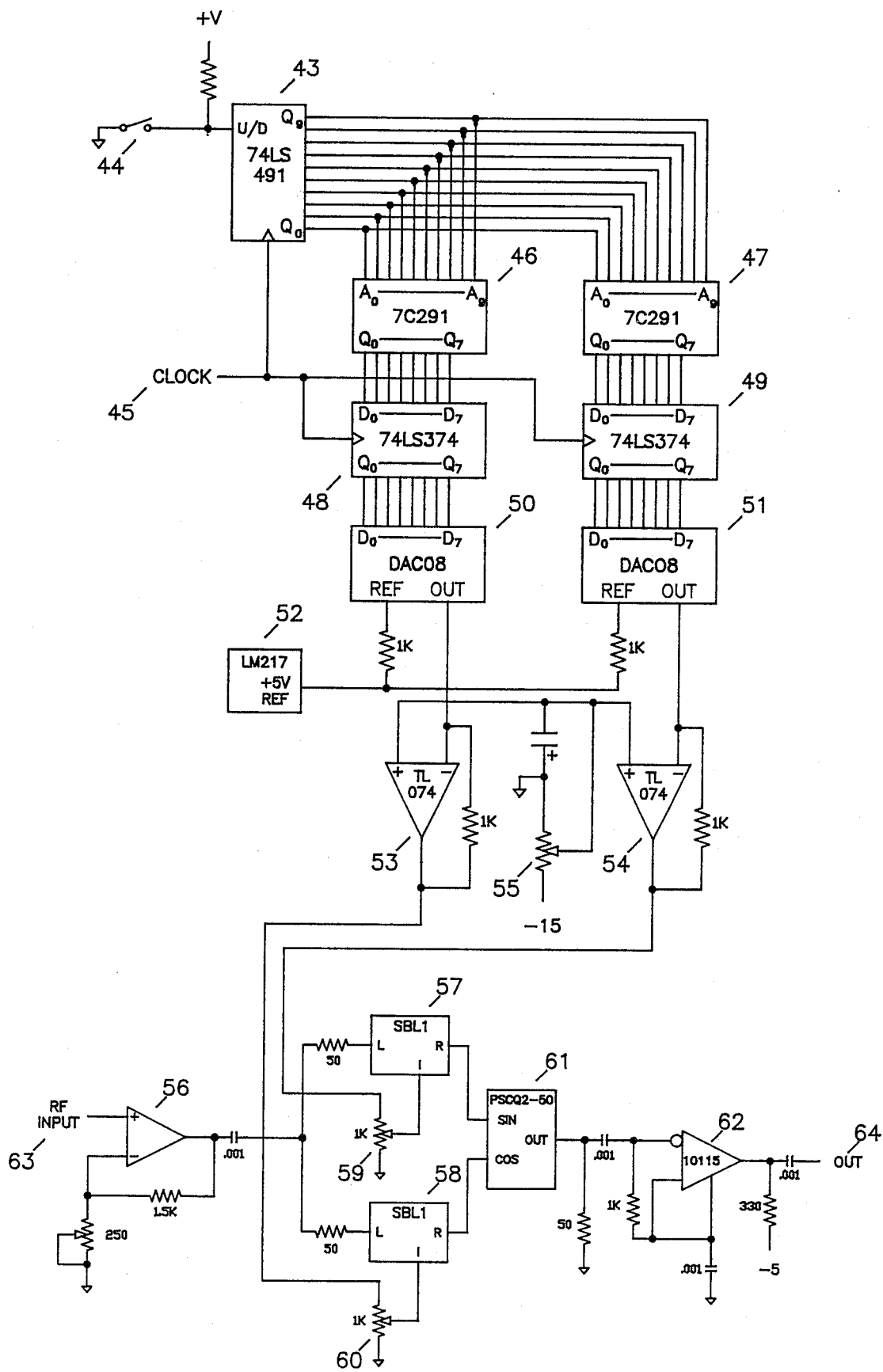
FIG. 8 is a drawing of a fourth embodiment of the invention.

FIG. 8 shows a schematic diagram of a fourth embodiment of the invention showing a 74LS491 up/down counter 43 having up/down control 44 and clock 45, sine PROM 46, cosine PROM 47, latches 48 and 49, D-A's 50 and 51, five volt reference 52 Op Amps 53 and 54, D.C. offset adjustment 55, RF Buffer 56 having RF input 63, doubly balanced mixers 57 and 58, gain controls 59 and 60, 90° power splitter/combiner 61, ECL Line Receiver 62, and RF ouptut 64.

One of the main shortcomings of the SSB modulator circuit is that the balanced modulator which it utilizes is a nonlinear device with respect to the carrier or RF input. Because of this nonlinear operation, odd order harmonics of the carrier are generated, and in addition, no amplitude components of the carrier are passed. These features may be desirable for SSB operation, however, it makes the circuit unusable for complex signal frequency addition.

FIG. 3 shows a first embodiment of the present invention which is similar in appearance to the SSB modulator of FIG. 1, however the operation is much changed by the replacement of the balanced modulators by portion generator means which in the preferred embodiment are comprised of linear four quadrant multipliers. Such multipliers are common components in the art, and are even available in integrated circuit form. A typical IC which is suitable for the multiplication function is the MPY634 manufactured by Burr-Brown of Tuscon, Arizona. Several other manufacturers make IC multipliers as well, and the proper selection of a particular component to perform the multiplication function depends on operating frequency, accuracy and other parameters which will become obvious from the present teachings.

Another component which can be utilized for the portion generator function is a double balanced mixer which is constructed utilizing diodes for the switching function. This coponent is normally utilized to provide a switching function similar to that of the balanced modulator, however if the signal levels into the mixer are kept to very low levels, in orcer to not saturate the diodes or transformers, the balanced mixer will operate as a fairly linear multiplier, and can be utilized for this function. One balanced mixer which has been successfully utilized is the MCL SBL-1 manufactured by Mini-Circuits of Brooklyn, N.Y. This manufacturer also provides detailed literature on the use of these components. This component is relatively insensitive to frequency variations, having a carrier or RF bandwidth of 1-500 MHz and a modulation signal or IF bandwidth from DC to 500 Mhz. The DC capability of the modulation signal input is quite important as will become apparent from the present teachings. The portion generators operate to output a signal whose frequency is determined by the main signal and whose amplitude is determined by the offset signal.

The operation of the invention of FIG. 3 is such that portion generator 12a operates on the main signal in response to the offset signal such that the amplitude of the output main signal is controlled by the absolute value of the offset signal, and the phase, or polarity of the output signal is controlled (in the present embodiment inverted) when offset signal is negative, the maximum amplitude may be greater, equal to, or less than the main signal, thus providing an output shown typically at 17. Vector adder 6b operates to combine the two signals which are input to it in additive fashion so that the output is the vector sum of the two inputs. In some applications it may be desirable to add buffering, amplification, AGC, limiting or other action to this vector adder or to the portion generators for proper coupling to subsequent circuitry or to otherwise improve circuit performance. In particular, where constant amplitude is desired, a limiter or AGC circuit of a type known to those skilled in the art could be included, as shown by 6c.

For the present disclosure the portion generator means will be described by way of example as if it is a linear multiplier, which is the preferred embodiment, however it will be understood by one skilled in the art that it may take on several other embodiments including balanced modulator, and balanced mixer, in both analog and digital versions.

The 90 phase shifter 15 could be included as part of the vector adder circuit. A particular device which has been successfully utilized to perform both the phase shift function 15 and the vector combination function 6b is the MCL PSCQ-2-50, manufactured by Mini-Circuits, which is a 2 way 90° power splitter/combiner. Power splitters of this type are also referenced to as hybrid splitters, and generally work equall well as combiners. The 90° phase shifter 15a could also be located at the position shown as 15b. It should be noted that it is necessary to combine portions of the main signal which are relatively phase shifted. These functions may be performed in any sequence, and the invention will work equally well. For example, the main signal may be phase shifted, then multiplied then combined, it may be multiplied, then phase shifted then combined, or it may be combined and phase shifted in the same operation, as with the use of the suggested PSCQ-2-50. The main signal may even be combined and multiplied in the same operation with a multiple input multiplier or other multiple gain or control device. One such device is the Analog Device's AD539 which has dual signal channels and a common control channel.

The phase inversion of the main signal, as shown by 17, should be noted, which inversion takes place during the negative portion of the offset signal. Multiplier 12b performs an identical function to 12a, but operates on the main signal in response to the offset signal which has been shifted by either +/−90 degrees by 14. It should be noted that the sum of the outputs from 12a and 12b when combined in 6b is constant, which can be recognized by inspecting the outputs when each offset signal (at the input of the multiplier) is zero. when 12a's input is 0, 12b's is at maximum. Conversely when 12b's input is 0, 12a's is maximum.

Consider now the situation when the offset signal input to 12a is at 0.707×the maximum (0.707=sine 45 degrees). The offset signal input to 12b will also be 0.707×the maximum since the offset signal which is phase shifted by 90 degrees by 14 will also have that same value (sine 45 degrees=sine 90±45 degrees). The output of 12a is phase shifted by 90 degrees of the main signal period by 15a, and then combined with the output of 12b in the combining means 6b. It will be recognized with a little study that the vector sum of the two multiplied main signals is a signal at the maximum amplitude, but phase shifted by 45 degrees with respect to the main signal ouptut from 12a (0.707 $\phi$+0.707 $\phi$90=∠45). From the present invention explanation it will be apparent to one skilled in the art that as the offset signal is shifted in phase, the portions of the main signal which are passed by the multipliers is changed in order to provide a continous phase shift to the main signal.

Following the phase sequence of the offset signal, assuming it is sinesoidal and assuming that the maximum values of both the offset signal and main signal are +/−1, making the value of the signal input to 12a and 12b equal to the value of the sine and cosine respectively of the phase angle of the offset signal output from 11 gives the following:

| phase of offset signal | value of 12a input | value of 12b input | phase of 6b output |
|---|---|---|---|
| 0 deg. | 0 | 1 | 0 deg. |
| 45 | .707 | .707 | 45 |
| 90 | 1 | 0 | 90 |
| 135 | .707 | −.707 | 135 |
| 180 | 0 | −1 | 180 (or −0) |
| 225 | −.707 | −.707 | 225 |
| 270 | −1 | 0 | 270 |
| 315 | −.707 | .707 | 315 |
| 360 | 0 | 1 | 360 (or 0) |

One of the inventive concepts of the present invention is that the phase of the main signal output from 6b corresponds to the value or phase of the offset signal. In addition, since multipliers may be utilized for 12a and 12b, the operation therefore may be linear with respect to amplitude which allows complex main signals to be operated on without destroying the amplitude information contained thereon. The invention therefore has the ability to impart a precise and continuously adjustable phase shift to the main signal. Complex offset signals may also be used.

Another inventive concept to note at this point is that the phase shift which is applied to the main signal is continuous, that is there is no end to the amount of phase shifting which may be imparted to the main signal. If the offset signal is a continuous sinesoidal signal, the signal output from 6b is continuously phase shifted, which is the same as a frequency offset. In other words, the frequency of the offset signal is subtracted from the main signal.

The 90 degree phase shift 14 is provided with a control 16 which selects either a positive or a negative 90 degree shift. This control in effect inverts the polarity of the offset signal input to 12b, thus inverting the polarity of the main signal output from 12b. The overall effect of such a polarity change is to cause the phase of the output from 6b to correspond to the inverse of the phase of the offset signal. In terms of frequency, this means that the frequency of the offset signal is added to the main signal. It will be understood by one skilled in the art that the change from adding frequency (or phase) to subtracting frequency (or phase) may be performed as well by changing 15 to a −90 degree phase shift, or by inverting any of the signals input to or output from the multipliers in order to achieve the opposite polarity of vector addition.

Stated in other words, the laws of trigonometry may be applied to the phase shifts and signal inversions described in the present teachings to achieve the proper vector results. It may be noted that there are numerous combination of phase shifts and inversions which may be resorted to, as well as several trigonometric identities and equalities which may be utilized in configuring the circuitry or steps of methods of practicing the invention as taught herein. From the teachings herein, one skilled in the art will be capable of making use of these aforementioned combinations to optitimize the circuitry or steps to fit a particular application. It will be understood that in the claims and present disclosure, the recitation of a particular combination of functions is given by way of description or example and is meant to include the various alternative combinations mentioned above, as well as the specific combinations and arrangements given herein.

FIG. 4 shows another embodiment of the invention in which the offset signal generator means 18 generates two signals in quadrature phase which are applied to a combiner means 19. Combiner means 19 contains portion generators 27a and 27b corresponding to 12a and 12b of FIG. 3 in function. Combiner means 19 also contains a vector adder 28, which corresponds to 15 and 6b of FIG. 3 as was previously discussed. The two quadrature signals from 18 are suitable coupled to 27a and 27b of 19 as is the main signal. The outputs of 27a and 27b are combined in the vector adder 28, which also performs the equivalent of the 90 degree phase shift corresponding to 15 of FIG. 3a. The output of 28 is the phase shifted main signal corresponding to the output of 6b of FIG. 3a. The output signals of 18 are presently described in quadrature relationship which is the preferred form of the embodiment, however other phase angles may be used as well as will be apparent to one skilled in the art from the present teachings.

The offset signal generator means used in this application is one of the inventive concepts of the present embodiment of the invention. The design of the offset signal generator is such that it may provide signals in quadrature at varying phase or frequency. The control of the preferred embodiment shown here by way of example is by a clock 22 and up/down 21 digital signals. These signals are provided either internally or from other functional means as will be discussed by way of example with respect to FIGS. 6 and 7. For the purpose of explanation of the present element 18, it will be assumed that the clock may be started or stopped at will, and is variable in frequency, and that the up/down signal may be changed as needed. It will be understood that the up/down signal has the same effect as changing the control 16 of FIG. 3a, and that the clock signal has the same effect as changing the frequency of the offset signal of 11 of FIG. 3a.

Both the clock and up/down signals are applied to a binary counter 20 which counts clock pulses in binary sequence either up or down in response to the the state of the up/down signal. One such device is the 74LS491 IC manufactured by Monolithic Memories of Santa Clara, CA. The parallel digital outputs from the counter (which number 10 in the example of the 74LS491) are coupled to the address inputs of two programmable read only memories (PROM) 23 and 24 in which are stored the binary value of the sine and cosine of the particular digital word applied to their address inputs. Numerous PROM IC's are available which may be utilized for 23 and 24, and ROMs which are already programmed with the sine and cosine values are available under part number AM29526–AM29529 from Advanced Micro Devices of Sunnyvale, CA. These devices provide 16 bit accurate values for 0–180 degrees with 2048 bit phase accuracy. Trigonometric identities can easily be utilized by one skilled in the art to arrive at the values for 180–360 degrees and properly utilize these parts. For example, for these parts sine n=-sine n-180 degrees and cosine n=-cosine n-180 degrees.

The combined operation of the counter 20 and PROM's 23 and 24 is to provide digital sine and cosine values for each clock pulse of 22. The configuration is such that for the suggested 74LS491 there will be 2 exp. 10 values of sine and cosine which represent 1024 values per 360 degrees. The phase resolution of the combination is thus 360 degrees: 2 exp. 10 where n is the size of the counter 20. In the present example n=10 and the resolution is 0.35 degrees. If the counter 20 is caused to count down by 21, this will have the effect of inverting the cosine output with respect to the sine output.

The digital values of sine and cosine are applied to digital to analog converters (D-A) 26 and 25 respectively, where the digital value is converted to an analog value. D-A converters are manufactured by serveral IC manufacturers, and two such devices which may be utilized are the ADC1025 and the DAC0800 by National Semiconductor. The analog value from each D-A is coupled to the combiner means 19. From the present explanation and example, it will be apparent to one skilled in the art that the offset signal geenrator means 18 provides quadrature or other phase related signals will very good and predictable phase resolution. It will be further apparent that the phase resoluton and frequency of the signals output from 18 are precisely controlled by the clock 22 and up/down 21 signals. Recalling the previous explanation of FIG. 3a, it will now be further apparent that the phase of the main signal which is output from 19 will be precisely controlled in both phase and frequency by 21 and 22. Of particular note is the ability of the embodiment of FIG. 4 to shift the phase of the main signal by extremely fine increments, in the present example 0.35 degrees. If 16 bit counter PROMs and D-A's were utilized for 20, the phase increment would be 0.005 degree. It should also be noted that the phase shifting may be continuous, at fast, or slow rates, or intermittent rates, or may reverse direction, all in response to 21 and 22. Of course the above abilities also mean that the main signal may be shifted in frequency by very small or very great amounts, or even by varying or non-uniform amounts, all in response to signals 21 and 22.

Other arrangements of the offset signal generator means may be utilized as well, for example, multiple counters 20 may drive different PROMs, having the same data, with the phase offset being accomplished in the counters. One counter may also be utilized to drive different PROMs, with the counter output having the phase shift added to it, for example by inverting one or more bits, such as the MSB, as part of coupling to the PROM.

It is important to note again that if 27a and 27b are linear multipliers, the main signal may be complex in nature, and will not be clipped or distorted by the device. If however it is not necessary to pass any amplitude information, nonlinear devices such as the balanced modulators of the prior art may be utilized for 27a and 27b. The output of 28 will then contain spurious harmonic components which will probably need to be filtered out of the signal for most applications. The resultant circuit will then provide the capability of precisely phase or frequency shifting the main signal in response to the clock and up/down signals, but without passing any amplitude information.

Accurate frequency and phase shift of a main signal by the present invention can be extremely useful. The invention is considerably simpler than phase locked loops, providing precision control with fewer parts, especially for very small or very large shifts. As one example of the usefulness of the invention, consider the problem of locking a high stability signal source such as a crystal oscillator at 39.000 Mhz to another source which is very close in frequency such as a second crystal oscilaltor at 39.001 Mhz. Prior art techniques utilize PLL's which are complex and generate large amounts of phase noise compared to the crystal. Tunable crystal oscillators are available, however they are not nearly as stable as fixed frequency oscillators, and they can not be tuned very far, 0.5% being a practical limit before serious difficulties are encountered. With the use of the present invention, a fixed frequency and therefore highly stable oscillator at 39.000 Mhz can be added to a 1 Khz signal to achieve a frequency and phase lock to the 39.001 Mhz signal. The output will have the basic phase noise and stability characteristics of the 39.000 Mhz oscillator but will have the tunability range of a PLL, all with fewer parts and lower cost. The embodiment of FIG. 4 can perform just such a task.

The embodiment of the invention of FIG. 4 may be expanded to include more offset signals in order to improve the phase control accuracy of the invention. In the invention of FIG. 4, if there are any imperfections in the portion generators 27a and 27b, that imperfection contributes considerably to the output signal, especially when the offset signal to the other portion generator is zero. By increasing the number of portion generators, and phases of offset signals, the contribution of error to the output signal is decreased since more than one portion generator will contribute to the output at all times. Such an embodiment of the invention is shown in FIG. 5.

FIG. 5 shows a main signal generator 29 coupled to a combiner means 31 similar to 19 of FIG. 4, except it contains multiple portion generators 33a–33n. The outputs of 33a–n are combined in vector adder 34 to provide the phase shifted main signal output. FIG. 5 also shows offset generator 30 which provides multiple phases of the Offset signal $\phi A$ thru $\phi N$. These multiple phase signals are coupled to the multipliers 33a–n similar to the outputs of 25 and 26 of FIG. 4. Such an offset signal generator can be constructed with the technique of 18 of FIG. 4 by utilizing multiple PROMs and D-As with each PROM and D-A pair generating one phase. Particular attention should be given to embodiments which operate with three offset phase spaced at 60 degrees, and 4 offset phases spaced at 45 degrees. The operation of the embodiment of FIG. 5 is very similar to that of FIG. 4, and one skilled in the art will be able to construct and practice this embodiment of the invention from the present teachings.

FIG. 6 shows a frequency error detector for use with the invention, enabling a main signal to be frequency and phase locked to another signal. Explanation of the detector of FIG. 6 as it would be operated with the invention of FIG. 4 will be given by way of example. The output signal from 28 is suitably coupled to the feedback input, FB, of 35, a digital frequency /phase detector of a type well known in the art such as the Motorola MC 4044. Coupling for example would include converting the low level sinesoidal output from 28 to standard TTL levels by use of a comparator such as the National Semiconductor LM360. The reference signal to which the main signal is to be locked is coupled to the reference input REF of 35. The phase and frequency error signals PU and PD output from 35 are coupled to an integrator 36 in a fashion such that the integrator charges up for errors in a first direction, and down for errors in the other direction. The output of the integrater 36 is then a signal reflecting magnitude of the frequency and phase different between the reference signal and the main signal output from 28. The output of 36 is coupled to 38, a comparator configured as a polarity detector, and the output of 38 is coupled to 21 to either increase or decrease the frequency of the main signal in response to clock 22. The output of 36 is also coupled to an absolute value amplifier 37 which outputs a signal which corresponds to the magnitude of the frequency difference between the main and reference signals, and the output of 37 is coupled to a voltage controlled oscillator (VCO) 39. The VCO generates a clock signal which is coupled to the clock 22 to clock counter 20.

In operation, the phase frequency detector 35 will cause integrator 36 to charge up or down, depending on whether the frequency of the output from 28 is higher or lower than the refrence. Polarity detector 38 causes the adder 20 to count up or down as needed to increase or decrease the frequency of the output. Integrator 36 will continue to charge, thus increasing the frequency of the VCO via 37 until the VCO frequency is fast enough to cause the output signal to match the reference signal. Upon proper phase and frequency match, the output 35 stops charging the integrator, which will maintain a constant output. Any change in reference, main signal or drift of any of the components will automatically be compensated for, as in a typical PLL. The functions provided by 36, 37, 38 and 39 are well known in the art and can be easily designed. More information on these functions may be had by referring to manufacturers application literature, such as the National Semiconductor linear applications notes and briefs, available from National Semi. Sunnyvale, CA.

FIG. 7 shows a Phase error detector which may be coupled to the invention to provide automatic adjustment of the main signal to a phase reference. FIG. 7 shows a phase detector 40 having a reference input REG to which the phase reference is coupled. The output signal from 28 is coupled to the feedback input F.B. of 40. A MC4044 is suitable for this function. An error difference between the reference signal and the output signal will cause 40 to output either PU or PD outputs, depending on the polarity of the error. The PU and PD outputs from 40 are coupled to up/down detector 42 which generates a up/down signal which is coupled to 21, in response to the polarity of the phase error, in order that the output signal will be corrected in the proper direction. The PU and PD signals are also coupled to a combiner 41 which generates a clock signal which is coupled to 22 to clock the counter 20. A clock pulse is generated at every period of the reference signal thus causing the counter to shift the phase of the offset signal until the output signal which is coupled to the F.B. input to 35 is in phase with the reference. When the F.B. signal and the REF signal are in phase, 40 stops providing PU or PD signals, thus stopping the clocking of 20, thereby maintaining phase lock. As with the circuit of FIG. 6, any drift or change will be automatically corrected. Of course various circuitry can be inserted in the path of the output signal from 28 in either operation with the circuit of FIG. 6 or 7, and the circuit will correct any changes or drifting caused by that circuitry as well. Frequency or phase offsets can be incorporated into these error detectors as is known in PLL art, to cause a frequency or phase offset to be generated.

FIG. 8 shows a schematic of an embodiment of the present invention for use in shifting the phase and/or frequency of RF signals in the 40 MHz range. The limiting factor in frequency response of the R.F. portion of the circuit is the 90° phase splitter 61 which operates from 25 to 50 Mhz. For other frequencies, other versions of this component are available.

The circuit of FIG. 8 is very similar to the drawing of FIG. 4 in operation, however FIG. 8 is more detailed. A TTL clock 45 is applied to 43 causing 43 to count up or down as determined by 44, similar to 20 of FIG. 4. The 10 output lines from 43 are connected to 10 address inputs of 46 and 47, with 46 and 47 providing sine and cosine values, respectively at their outputs in response to the value of the address input, similar to 23 and 24 of FIG. 4. In this arrangement, 360° of signal phase is represented by the 1024 counts output from 43, and 46 & 47 provide sine and cosine values for each of these values. The outputs of 46 and 47 are latched in 48 and 49, to remove glitches and applied to D-A convertors 50 and 51. The D-A's generate an analog voltage output, referenced to ground at the most negative peak. These positive offset outputs from 50 and 51 are therefore passed to op amps 53 and 54 where they are D.C. offset to change to AC signals having equal positive and negative peaks. The AC signals output from 53 and 54 are therefore sine and cosine values of a sinesoidal signal which is generated in response to clock 45 and up down control 44, which changes the relative phase of the signals from +90° to −90°. These signals correspond to the outputs of 25 and 26 of FIG. 4. The outputs of 53 and 54 are coupled to 57 and 58 corresponding to 27a & b thru level adjustments 59 and 60 to allow 57 and 58 to operate in a linear mode by ensuring that the internal diodes are not saturated. An RF input, in this example in the 40 MHz range, is applied to RF input 63 and is buffered by 56 Comlinear CLC401, which has a gain control to ensure that the RF is at the proper operating level for 57 and 58 as called for by the manufacturer. The RF output from 56 is AC coupled and source terminated in order to properly couple to the inputs of 57 and 58. The outputs of 57 and 58 are coupled to the 0° and 90° inputs of 61, corresponding to 28, where they are combined. The output of 61 is properly terminated and AC coupled to 62, an ECL Line Receiver which operates as a level clipper and buffer, providing a low impedance ECL level ouptut of the phase shifted R.F. signal at 64. From the teachings herein, one skilled in the art will be able to utilize this schematic, or to modify it as required in order to practice the invention in various applications.

It will be understood that the previous descriptions and explanations are given by way of example, and that numerous changes in the combinations of elements and functions as well as changes in design of the above may be made without departing from the spirit and scope of the invention as hereinafter claimed. In particular, the invention may be practiced in various forms which rely upon trigonometric equalities and identities, and signals may take on either analog or digital form. In addition, it will be useful to combine the functions of the invention with other functions in a fashion so that such functions may be shared between devices or methods.

What is claimed is:

1. Apparatus for generating a phase shifted version of an input signal including in combination an offset signal generator means to provide a plurality of relatively phase shifted offset signals and a combination means responsive to said input signal and said plurality of offset signals to generate an output signal comprised of a combination of a plurality of portions of the input signal, each portion of which is responsive to one of said offset signals and said input signal such that each said portion of input signal is equivalent to a phase shifted portion of said input signal which portion is responsive to said offset signal, which output signal is the phase shifted version of said input signal.

2. Apparatus for generating a phase shifted version of an input signal including in combination an offset signal generator means to provide a plurality of offset signals of differing relative phase and a combination means responsive to said input signal and said plurality of offset signals to generate an output signal comprised of a combination of a plurality of portion signals, each portion of which is responsive to one of said offset signals and said input signal such that each said portion signal is equivalent to a phase shifted input signal multiplied by said offset signal, which output signal is the phase shifted version of said input signal.

3. Apparatus for generating a phase shifted version of an input signal including in combination an offset signal generator means coupled to receive an offset signal to provide a plurality of phase shifted versions of said offset signal and a combination means responsive to said input signal and said plurality of said phase shifted offset signals to generate an output signal comprised of a combination of a plurality of portions of the input signal, each portion of which is responsive to one of said phase shifted offset signals and said input signal such that each said portion signal is equivalent to a phase shifted portion of said input signal and wherein the quantity of said portion is responsive to one of said phase shifted offset signals, which output signal is the phase shifted version of said input signal.

4. Apparatus for generating a phase shifted version of an input signal including in combination an offset signal generator means to provide a plurality of offset signals of differing relative phase, a fixed phase shift means to provide a phase shifted input signal, and a combination means responsive to said input signal and a first of said offset signals to generate a first portion signal and further responsive to said phase shifted input signal and a second offset signal to generate a second portion signal and to generate an output signal comprised of a combination of said of portion signals which output signal is the phase shifted version of said input signal.

5. Apparatus as claimed in claims 1, 2, 3 or 4 wherein said combination means includes a derivation means, and said derivation means multiplies the input signal in phase shifted or unphase shifted form by one of the offset signals.

6. Apparatus as claimed in claims 1, 2, 3 or 4 wherein a derivation means includes a controlling means, and said controlling means controlling the amplitude of the input signal in relatively unphase shifted form in response to one of the offset signals.

7. Apparatus as claimed in claims 1, 2, 3 or 4 wherein said combination means shifts the portion signals by a fixed amount of phase before being used to generate said output signal.

8. Apparatus as claimed in claims 1, 2, 3, or 4 wherein said combination means combines the portion signals in relatively different phases in the process of generating said output signal.

9. Apparatus as claimed in claims 1, 2, 3, or 4 wherein said portion signals are combined and the resultant combination is operated on by an amplitude controlling means to maintain a controlled amplitude of said output signal.

10. Apparatus as claimed in claims 1, 2, 3, or 4 wherein said offset signal generator means contains a digital counter means responsive to a clock signal to provide a counting signal which is coupled to a memory means to provide a trigonometric signal which is coupled to a D to A convertor means to provide oe of said offset signals.

11. Apparatus as claimed in claims 1, 2, 3 or 4 wherein said apparatus includes a phase error detecting means responsive to said output signal and a reference signal to generate an error signal responsive to the relative phase error thereof, and said offset signal generator being responsive to said error signal to maintain said output signal at a known phase with respect to said reference signal.

12. Apparatus as claimed in claims 1, 2, 3 or 4 wherein said apparatus includes a frequency error detecting means responsive to said output signal and a reference signal to generate an error signal responsive to the relative frequency error thereof, and said offset signal generator being responsive to said error signal to maintain said output signal at a known frequency with respect to said reference signal.

13. Apparatus for producing a phase shifted version of an input signal including in combination an offset signal generator means responsive to a clocking signal to provide a plurality of offset signals of differing relative phase wherein the phase of each of said offset signals may be incremented with respect to a given phase in response to said clocking signal, and a plurality of portion generating means each of which is responsive to one of said offset signals and said input signal which may have been phase shifted by a fixed amount each of which portion generating means operates to output a portion signal having a frequency equivalent to the frequency of said input signal and an amplitude responsive to said one offset signal, and an adder means responsive to each of said portion signals to generate an output signal which output signal is said phase shifted version of said input signal.

14. Apparatus as claimed in claim 13 wherein said adder means combines at least one portion signal with another portion signal.

15. Apparatus as claimed in claim 13 wherein said offset signal generator produces a plurality of offset signals in quadrature and said adder means combines a plurality of said offset signals.

16. Apparatus for producing a phase shifted version of an input signal including in combination an offset signal generator means responsive to a clocking signal to provide a plurality of offset signals in quadrature phase wherein the phase of said offset signals is incremented with respect to a given phase in response to said clocking signal, and where the direction of said increment is responsive to a direction signal, and a plurality of portion generating means each of which is responsive to one of said offset signals and said input signal each of which portion generating means operates to output a portion signal having a frequency equivalent to the frequency of said input signal and an amplitude responsive to said one offset signal and an adder means responsive to combine a plurality of said portion signals in quadrature to generate an output signal which is said phase shifted version of said input signal.

17. Apparatus as claimed in claim 16 wherein said portion generating means includes a multiplier.

18. Apparatus as claimed in claim 16 wherein said portion generating means includes a double balanced mixer.

19. Apparatus as claimed in claim 16 wherein said adder means is comprised of a 90° power combiner.

20. Apparatus as claimed in claim 16 wherein said output signal is operated on by an amplitude controlling means to maintain a known amplitude of said output signal.

21. Apparatus for producing a phase shifted version of an input signal including in combination an offset signal generator means responsive to a clocking signal to provide a plurality of offset signals in quadrature phase wherein the phase of said offset signals is changed with respect to a given phase in response to said clocking signal, and where the direction of said change is responsive to a direction signal, and a plurality of multiplier means each of which is responsive to one of said offset signals and said input signal to output a portion of said input signal which portion is responsive to said one offset signal and an adder means comprised of a 90° power combiner operative to combine a plurality of said portion signals in quadrature to produce an output signal which is said phase shifted version of said input signal.

22. Apparatus as claimed in claim 21 wherein said output signal is operated on by an amplitude controlling means to maintain a known amplitude of said output signal.

23. Apparatus as claimed in claim 21 wherein said apparatus includes a phase error detecting means responsive to said output signal and a reference signal to generate an error signal responsive to the relative phase error thereof, and said offset signal generator being responsive to said error signal to maintain said output signal at a known phase with respect to said reference signal.

24. Apparatus as claimed in claim 21 wherein said apparatus includes a frequency error detecting means responsive to said output signal and a reference signal to generate an error signal responsive to the relative frequency error thereof, and said offset signal generator being responsive to said error signal to maintain said output signal at a known frequency with respect to said reference signal.

* * * * *

(12) EX PARTE REEXAMINATION CERTIFICATE (6326th)
United States Patent
Cooper

(10) Number: US 4,868,428 C1
(45) Certificate Issued: Jul. 29, 2008

(54) APPARATUS FOR SHIFTING THE FREQUENCY OF COMPLEX SIGNALS

(75) Inventor: J. Carl Cooper, Sunnyvale, CA (US)

(73) Assignee: Technology Licensing Corporation, Walnut Creek, CA (US)

Reexamination Request:
No. 90/006,860, Nov. 13, 2003

Reexamination Certificate for:
Patent No.: 4,868,428
Issued: Sep. 19, 1989
Appl. No.: 07/172,283
Filed: Mar. 23, 1988

Related U.S. Application Data

(63) Continuation-in-part of application No. 07/016,923, filed on Feb. 20, 1987, now Pat. No. 4,829,257.

(51) Int. Cl.
*H03H 7/20* (2006.01)
*H03H 7/00* (2006.01)

(52) U.S. Cl. .......... 327/248; 327/113; 375/270; 375/301

(58) Field of Classification Search ............ None
See application file for complete search history.

(56) References Cited

U.S. PATENT DOCUMENTS 3,440,548 A * 4/1969 Saltzberg ............ 327/94
3,475,626 A 10/1969 Hotzman et al.
3,725,772 A 4/1973 Ratzel
4,431,969 A 2/1984 Summers et al.

FOREIGN PATENT DOCUMENTS

JP 57-176823 10/1982

* cited by examiner

*Primary Examiner*—Minh Nguyen

(57) ABSTRACT

The invention described herein provides an apparatus and method for accurately shifting the phase or frequency of a complex signal.

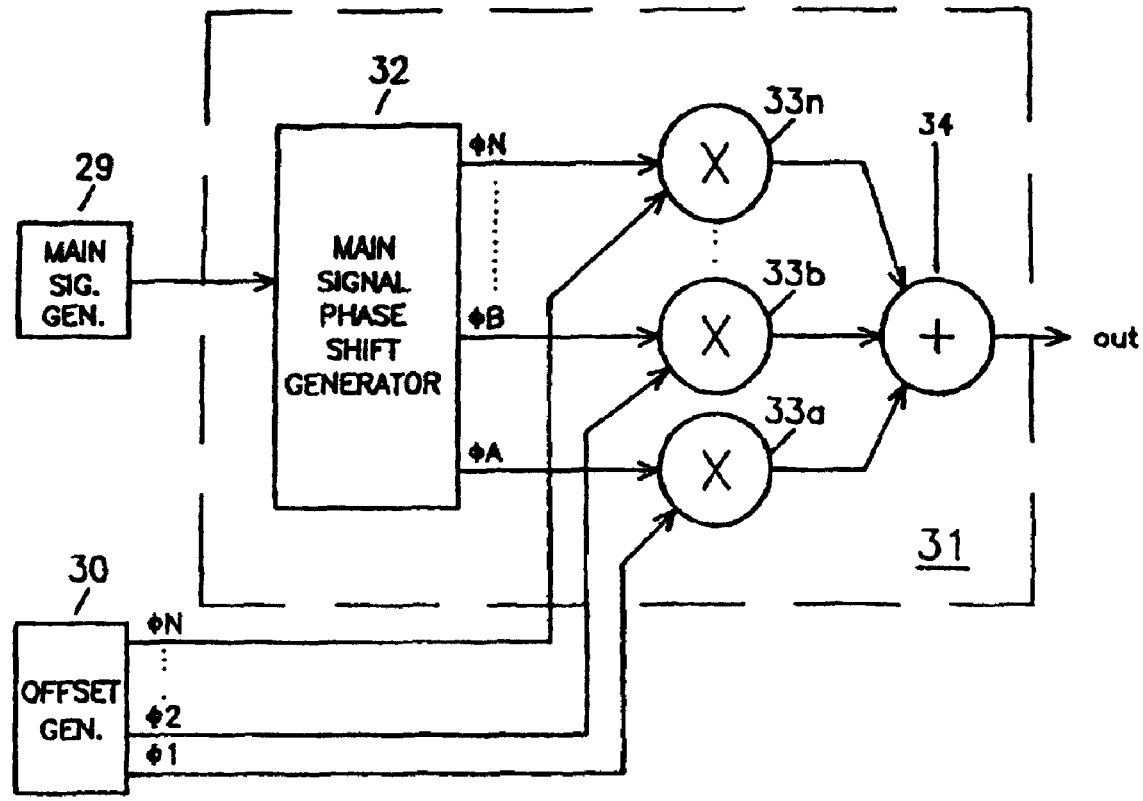

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–24 is confirmed.

* * * * *